(12) United States Patent
Suzuki et al.

(10) Patent No.: US 7,389,028 B2
(45) Date of Patent: Jun. 17, 2008

(54) MULTIPLE RESONATOR AND VARIABLE-WAVELENGTH LIGHT SOURCE USING THE SAME

(75) Inventors: Kouichi Suzuki, Tokyo (JP); Hiroyuki Yamazaki, Tokyo (JP)

(73) Assignee: NEC Corporation, Tokyo (JP)

( * ) Notice: Subject to any disclaimer, the term of this patent is extended or adjusted under 35 U.S.C. 154(b) by 168 days.

(21) Appl. No.: 11/318,582

(22) Filed: Dec. 28, 2005

(65) Prior Publication Data

US 2006/0153267 A1    Jul. 13, 2006

(30) Foreign Application Priority Data

Jan. 11, 2005    (JP) ............................. 2005-004560

(51) Int. Cl.
*G02B 6/26* (2006.01)
(52) U.S. Cl. ........................................ 385/50; 372/94
(58) Field of Classification Search ................ 385/51, 385/5, 50; 372/92, 36, 75, 72
See application file for complete search history.

(56) References Cited

U.S. PATENT DOCUMENTS

| 6,411,752 | B1 * | 6/2002 | Little et al. ..................... 385/17 |
| 6,636,668 | B1 * | 10/2003 | Al-hemyari et al. .......... 385/40 |
| 7,065,276 | B2 * | 6/2006 | Scheuer et al. ................ 385/50 |
| 2003/0231826 | A1 * | 12/2003 | Boyd et al. .................... 385/27 |
| 2004/0062476 | A1 * | 4/2004 | Jones ............................ 385/30 |
| 2006/0051010 | A1 * | 3/2006 | Chu et al. ....................... 385/5 |

OTHER PUBLICATIONS

Kobayashi, Isao, "Integrated Optic Device", first edition, second printing, Kyoritsu Shuppan Co., Ltd., Dec. 2000, pp. 104-122.

* cited by examiner

*Primary Examiner*—Minsun Oh Harvey
*Assistant Examiner*—Tuan N. Nguyen
(74) *Attorney, Agent, or Firm*—Foley & Lardner LLP (57) ABSTRACT

An external resonator which includes a multiple resonator with parameters which allow stable wavelength control, and a variable-wavelength light source includes such an external resonator are provided. The external resonator is a multiple resonator which is made up of first to third ring-shaped resonators, each having different light path length, and connected in series via optical coupling means. The parameters of the multiple resonator are characterized in that all the following Expressions <1>, <2> and <3> hold:

$$L1 = \{M1/(M1-1)\}L0 \quad <1>$$

$$L2 = \{M2/(M2-1)\}L0 \quad <2>$$

$$M2-1 = (M1-1)^2 \quad <3>$$

where L0 is the light path length of the first resonator, L1 is the light path length of the second resonator and L2 is the light path length of the third resonator, and M1 and M2 are integers of 3 or greater.

13 Claims, 6 Drawing Sheets

MULTIPLE RESONATOR AND VARIABLE-WAVELENGTH LIGHT SOURCE USING THE SAME

BACKGROUND OF THE INVENTION

1. Field of the Invention

The present invention relates to a multiple resonator and variable-wavelength light source used for an optical multiplexing transmission system such as a WDM (Wavelength Division Multiplexing) transmission system, and more particularly, to a multiple resonator having parameters that allow stable control of oscillation wavelength and a variable-wavelength light source using such a multiple resonator.

2. Description of the Prior Art

With the advent of a broadband communication age, introduction of a WDM transmission system, which is capable of communicating by a plurality of light wavelengths in a single system, is underway aiming at more efficient use of optical fibers. Recently, a DWDM (Dense Wavelength Division Multiplexing) transmission system, which multiplexes several tens of light wavelengths to realize faster transmission, is also being widely used. This requires the WDM transmission system to be furnished with light sources for their respective light wavelengths and the number of light sources required is drastically increasing as the degree of multiplexing increases. Moreover, a ROADM (Reconfigurable Optical Add/Drop Multiplexers) system which adds/drops an arbitrary wavelength at each node is recently being introduced in inter-city communications. The ROADM system not only expands the transmission capacity through multiplexing but also changes wavelengths to allow optical paths to be switched, which increases the degree of freedom in routing within an optical network.

As a light source for a WDM transmission system, a DFB-LD (Distributed Feedback Laser Diode) which performs longitudinal single mode oscillation has been widely used so far because of its ease of use and high reliability. The DFB-LD includes a diffraction grating having a depth of approximately 30 nm formed over an entire area of a resonator, whereby stable longitudinal single mode oscillation is obtained with a wavelength corresponding to the product of the period of the diffractiong rating and double the equivalent refractive index. However, the DFB-LD cannot perform tuning extending over a wide range of oscillation wavelength. For this reason, to construct a WDM transmission system, it is necessary to use a DFB-LD product which oscillates a wavelength corresponding to each ITU grid of a defined frequency. As a result, extra stock of a variety of types of products including spares in case of malfunction needs to be provided for operation of the system, which results in an increase of shelf control cost. Moreover, with the DFB-LD, the variable-wavelength range is limited to approximately 3 nm which can be changed by a temperature variation, and therefore the actual ROADM system is constructed of a fixed-wavelength light source and a wavelength control device. For this reason, it is expected to introduce a variable-wavelength light source into the ROADM system and drastically increase the degree of freedom in wavelength control.

In order to overcome these problems with the actual DFB-LD and realize longitudinal single mode oscillation over a wide wavelength range, research into a variable-wavelength laser as a variable-wavelength light source is being vigorously conducted. Some of studies detailed in Non-Patent Document (Isao Kobayashi, "Integrated Optic Device", first edition, second printing, KYORITSU SHUPPAN CO., LTD., December 2000, p. 104-122) will be referred and a conventional variable-wavelength laser will be explained below.

A variable-wavelength laser is largely divided into two types; one provided with a variable-wavelength mechanism inside a laser element and the other provided with a variable-wavelength mechanism outside the laser element.

As the former type, there is a proposal of a DBR-LD (Distributed Bragg Reflector Laser Diode) in which an active region producing a gain and a DBR region producing reflection by means of a diffraction grating are formed within the same laser element. The variable-wavelength range of this DBR-LD is approximately 10 nm at a maximum. There is also a proposal of a DBR-LD using a nonuniform diffraction grating in which an active region producing a gain and a DBR region which sandwiches the active region between anterior and posterior parts thereof are formed within the same laser element. In the anterior and posterior DBR regions, many reflecting peaks are produced due to the nonuniform diffraction grating and there is a slight difference in the interval of reflecting peaks between the anterior and posterior parts. This structure produces a so-called "vernier effect" providing an extremely wide variable-wavelength range. This DBR-LD using the nonuniform diffraction grating realizes variable-wavelength operation exceeding 100 nm and quasi-continuous variable-wavelength operation of 40 nm.

On the other hand, as the latter type, there is a proposal of a variable-wavelength laser which rotates a diffraction grating provided outside the laser element and returns light of a specific wavelength to the laser element.

However, though many structures are proposed for conventional variable-wavelength lasers, there are disadvantages such as a problem in securing stability called a "mode jump" that a desired wavelength is switched to an unexpected wavelength when wavelengths are switched or complicated wavelength control method, weak vibration resistance or high price due to an increase in the number of elements, and therefore the situation remains unfavorable for commercialization of such conventional variable-wavelength lasers.

The DBR-LD injects carriers into the DBR region, thereby changes a refractive index in this region and realizes variable-wavelength operation. For this reason, when crystal defects are increased by a current flow, the rate of change of the refractive index with respect to the current flow varies drastically, and therefore it is difficult to maintain laser oscillation at a constant-wavelength when used for an extended period of time. Furthermore, it is impossible to realize an "inchup" by 3 inches or more using the actual process technology of compound semiconductor. For this reason, using more complicated, large-sized laser elements will increase the price drastically.

On the other hand, in the structure with the variable-wavelength mechanism provided outside the laser element, mode jumps easily occur due to vibration, and therefore an extensive earthquake-resistant mechanism is required to avoid this, which leads to an increase in the module size and price.

SUMMARY OF THE INVENTION

It is an object of the present invention to provide a high-reliability, high-performance, low-cost multiple resonator capable of solving the problems in practical use of the conventional variable-wavelength laser and a variable-wavelength light source using such a multiple resonator.

The present invention provides an external resonator having three-resonator structures having parameters which allow stable wavelength control and a variable-wavelength light source including such an external resonator for a light generation apparatus constructed by combining the external resonator having a plurality of ring-shaped structures in a light feedback configuration such as an etalon filter and PLC type ring resonator, and an optical amplifier such as SOA.

The external resonator according to the present invention is a multiple resonator made up of first to third resonators each having different light path length connected in series via optical coupling means. The present invention is characterized in that all the following Expressions <1>, <2> and <3> hold:

$$L1 = \{M1/(M1-1)\}L0 \quad <1>$$

$$L2 = \{M2/(M2-1)\}L0 \quad <2>$$

$$M2-1 = (M1-1)^2 \quad <3>$$

where L0 is the light path length of the first resonator, L1 is the light path length of the second resonator and L2 is the light path length of the third resonator, and M1 and M2 are integers of 3 or greater.

In addition to a ring resonator made up of ring-shaped waveguides each having different light path length, each resonator can be anything that can serve as a resonator such as an etalon filter, Mach-Zehnder interferometer and birefringent crystal.

A variable-wavelength light source is constructed by forming an external resonator made up of this multiple resonator, input/output side waveguide and reflection side waveguide as one piece on a substrate and providing a light reflector at the other end of the reflection side waveguide of the substrate and an optical input/output unit at the other end of the input/output side waveguide via a non-reflective film. Furthermore, a variable-wavelength unit is provided which changes the resonance wavelength of the variable-wavelength light source by means of the multiple resonator.

The respective resonators making up the multiple resonator have FSRs (free spectral ranges) which are slightly different from one another due to differences in their light path lengths. For this reason, considerably large light transmission occurs at a wavelength (resonance wavelength) at which cyclic variations of light transmission at the respective resonators match.

The present invention constructs a multiple resonator with a plurality of resonators each having slightly different light path length connected in series and effectively uses a vernier effect generated in this way. When the variable-wavelength light source is constructed using the multiple resonator designed so as to satisfy the aforementioned Expressions <1>, <2>, <3>, the difference in transmission loss between an oscillating channel and adjacent channel. (hereinafter referred to as "mode gain difference") becomes a maximum. The present invention increases the mode gain difference in this way, and can thereby achieve stable variable-wavelength operation.

BRIEF DESCRIPTION OF THE DRAWINGS

Exemplary features and advantages of the present invention will become apparent from the following detailed description when taken with the accompanying drawings in which.

DETAILED DESCRIPTION OF THE PREFERRED EMBODIMENTS

The multiple resonator according to the present invention consists of first to third resonators, each having different light path length, connected to via optical coupling means. In addition to a ring resonator which will be explained in the following embodiments, each resonator can be anything that can at least serve as a resonator such as etalon filter, Mach-Zehnder interferometer and birefringent crystal.

Figure 1:
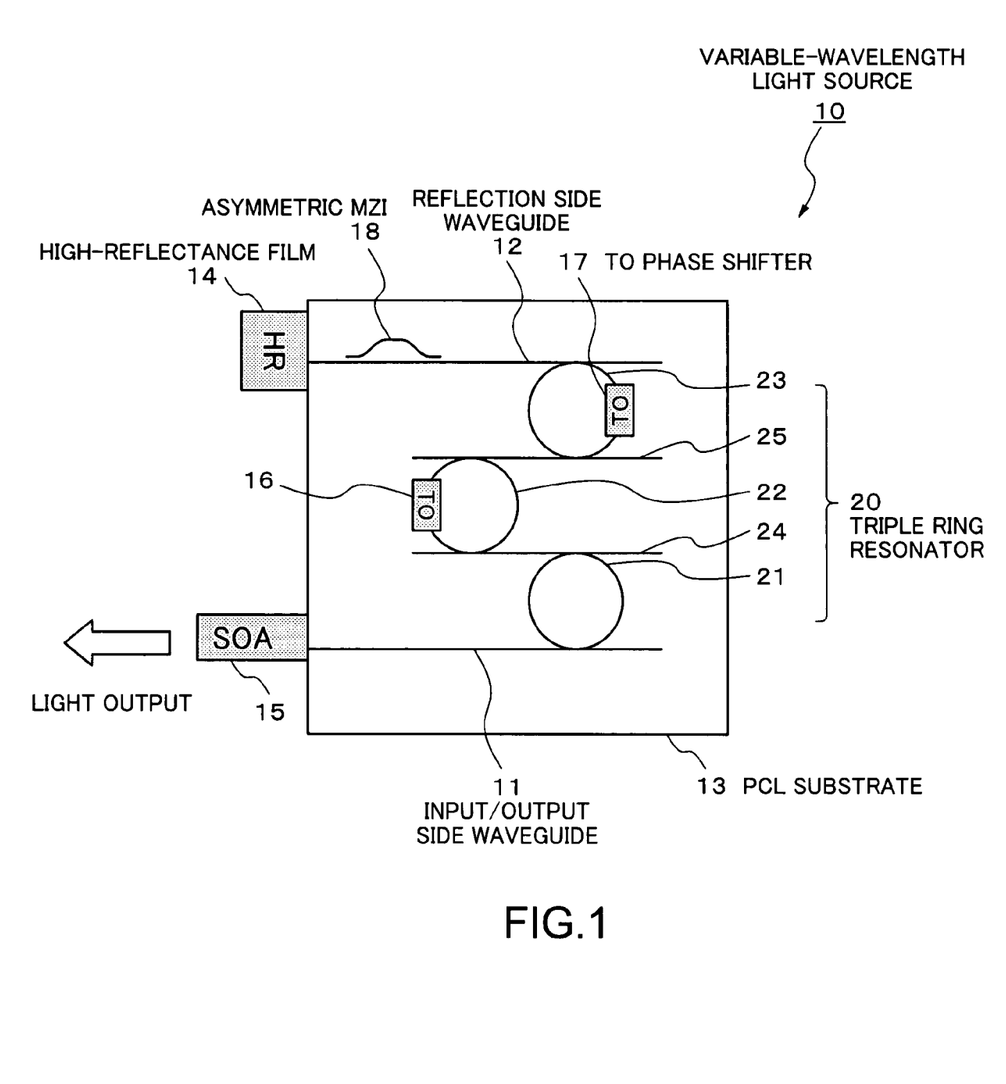
FIG. 1 is a plan view showing a first embodiment of a variable-wavelength light source according to the present invention.

FIG. 1 is a plan view showing a first embodiment of a variable-wavelength light source according to the present invention. This embodiment will be explained based on this figure below.

A variable-wavelength light source 10 of this embodiment consists of an external resonator constructed of a multi-ring resonator 20 made up of three ring resonators 21 to 23 each having different light path length connected via directional couplers (not shown hereafter) and waveguides 24, 25, an input/output side waveguide 11, one end of which is connected to the ring resonator 21 via the directional coupler and a reflection side waveguide 12, one end of which is connected to the ring resonator 23 via the directional coupler, all of which are formed on a PLC (Planar Lightwave Circuit) substrate 13, a high-reflectance film 14 provided at the other end of the reflection side waveguide 12 on the PLC substrate 13 and an SOA (Semiconductor Optical Amplifier) 15 as a light input/output unit, the light input/output unit end of which is connected to the other end of the input/output side waveguide 11 of the PLC substrate 13 via a non-reflective film (not shown) In addition to the SOA, the light input/output unit may be an optical amplifier such as an optical fiber amplifier or a light source such as semiconductor laser (laser diode). The waveguide may be formed of a material such as quartz glass and lithium niobate. Furthermore, the multi-ring resonator 20 is also provided with TO (thermooptic effect) phase shifters 16, 17, which are film-like hears, as a variable-wavelength unit which change the resonance wavelength and an asymmetric Mach-Zehnder interferometer 18 for band restrictions (hereinafter referred to as "asymmetric MZI") is inserted in the reflection side waveguide 12.

In the variable-wavelength light source 10 constructed as shown above, the principles of operation of the present invention are as follows.

Light emitted from the light input/output unit (SOA 15) is returned after passing through a path from the light input/output end→non-reflective film (not shown)→input/output side waveguide 11→multiple resonator 20→reflection side waveguide 12→light reflector 14→reflection side waveguide 12→multiple resonator 20→input/output side waveguide 11→non-reflective film (not shown)→light input/output end. This returned light has a resonance wavelength of the multiple resonator 20. The reason is that since the respective ring resonators 21, 22, 23 making up the multiple resonator 20 have slightly different FSRs (Free Spectral ranges), greater reflection is generated at a wavelength (resonance wavelength) at which cyclic variations of reflection (transmission) generated by the respective ring resonators match. Moreover, the wavelength of the matching cycle varies greatly depending on the circumferential length of each ring resonator and a variation of the waveguide refractive index, and therefore efficient variable-wavelength operation can be obtained. This waveguide refractive index can be changed by, for example, a thermooptic effect. The thermooptic effect is a phenomenon that a refractive index of a material increases by heat, and all materials normally have such a thermooptic effect. That is, it is possible to change the resonance wavelength of the multiple resonator using temperature characteristics of the plurality of ring resonators 21 to 23. Note that in addition to the thermooptic effect, it is also possible to change the wavelength using a refractive index control method or by controlling the circumferential length. The variable-wavelength means may be one that heats the ring resonator such as a film-like heater or one that cools the ring resonator or any technique for changing the refractive index of the optical material or means for mechanically changing the waveguide length.

The operation of the multiple resonator will be explained.

The multi-ring resonator 20 constitutes a light waveguide type filter with the three optically coupled ring resonators 21 to 23 each having different light path length and made up of ring-shaped waveguides. According to the multi-ring resonator 20, light signals having a resonance wavelength are multiplexed or demultiplexed only when all the ring resonators 21 to 23 resonate simultaneously and a large FSR (free spectral range) is obtained by a vernier effect. The vernier effect is a technique of combining a plurality of resonators each having slightly different resonator length to expand a variable-wavelength range and the respective resonance frequencies overlap one another at a frequency of the least common denominator of the resonance frequencies. For this reason, the FSR apparently functions as the frequency of the least common denominator of the respective rings. Thus, it is possible to control the characteristic over a wide frequency range much more easily than a single resonator.

However, depending on the combination of light path lengths of the ring resonators 21 to 23, since the mode gain difference is small, when the frequency characteristic of the gain of the optical amplifier and the length of the resonator change subtly, the loss of a mode which is different from a desired mode easily becomes a minimum and oscillation occurs at an undesired wavelength, producing so-called oscillation frequency hopping, which causes the operation to become unstable. Therefore, the multi-ring resonator 20 according to this embodiment optimizes the respective light path lengths of the ring resonators 21 to 23, increases the mode gain difference and stabilizes the oscillation operation.

That is, when the light path length of the ring resonator 21 is L0, the light path length of the ring resonator 22 is L1 and the light path length of the ring resonator 23 is L2, a condition that satisfies all the following Expressions <1>, <2>, <3> is considered to be an optimal condition.

$$L1=\{M1/(M1-1)\}L0 \qquad <1>$$

$$L2=\{M2/(M2-1)\}L0 \qquad <2>$$

$$M2-1=(M1-1)^2 \qquad <3>$$

When the variable-wavelength light source 10 is constructed using the multi-ring resonator 20 designed so as to satisfy these Expressions <1>, <2>, <3>, the mode gain difference becomes a maximum, and therefore it is possible to realize a stable variable-wavelength operation. Here, M1, M2 are called "vernier orders."

This will be explained in more detail below.

In the case of a variable-wavelength light source with an external resonator in a double ring resonator configuration using two ring resonators can secure a difference in transmission loss between the oscillating channel of the external resonator and adjacent channel (mode gain difference) of only approximately 0.4 dB, and so a mode jump is likely to occur. For this reason, it is difficult to maintain stable variable-wavelength operation for an extended period of time.

This embodiment constructs the variable-wavelength light source 10 by combining the PLC type external resonator which integrates the three ring resonators 21 to 23 and the asymmetric MZI 18 with the SOA 15 and applies an optimal design with a maximum mode gain difference to realize stable variable-wavelength operation. The three ring resonators 21 to 23 consist of the basic ring resonator 21 having a circumferential length L0 at which the FSR (free spectral range) becomes, for example, 50 GHz and two ring resonators 22, 23 having circumferential lengths L1, L2 defined by vernier orders M1 and M2 and provided with TO phase shifters 16, 17.

The circumferential lengths L1, L2 of the two ring resonators 22, 23 defined by M1, M2 are defined by the following expression. The circumferential length is equal to the aforementioned light path length.

$$Li=\{Mi/(Mi-1)\}L0 \qquad <5>$$

Here, when the FSR (free spectral range) is, for example, 50 GHz, suppose the refractive index of the quartz glass waveguide is approximately 1.5, the wavelength of light is 1.5 μm and the frequency of light is approximately 200 THz. Then, L0=4 [mm] from the following expression. L1 and L2 will be described later.

$$L0=(200\ [THz]/50\ [GHz])\times(1.5\ [\mu m]/1.5)$$

By controlling the phases of the two ring resonators 22, 23 using TO (thermooptic effect), it is possible to reduce the transmission loss of a desired wavelength to a minimum.

Asymmetric MZI 18 is designed to limit the oscillation wavelength to any one of a C band and L band and this embodiment is designed to operate in the L band. The SOA 15 and 90% high-reflectance film 14, both butt-coupled to the PLC substrate 13, are provided at the input/output side waveguide 11 of the PLC substrate 13 and at the end of the reflection side waveguide 12. A laser resonator is constructed between the light-emitting surface of the SOA 15 and high-reflectance film 14. Note that the input/output side waveguide 11 and SOA 15 may also be coupled using a lens instead of butt coupling.

Figure 2:
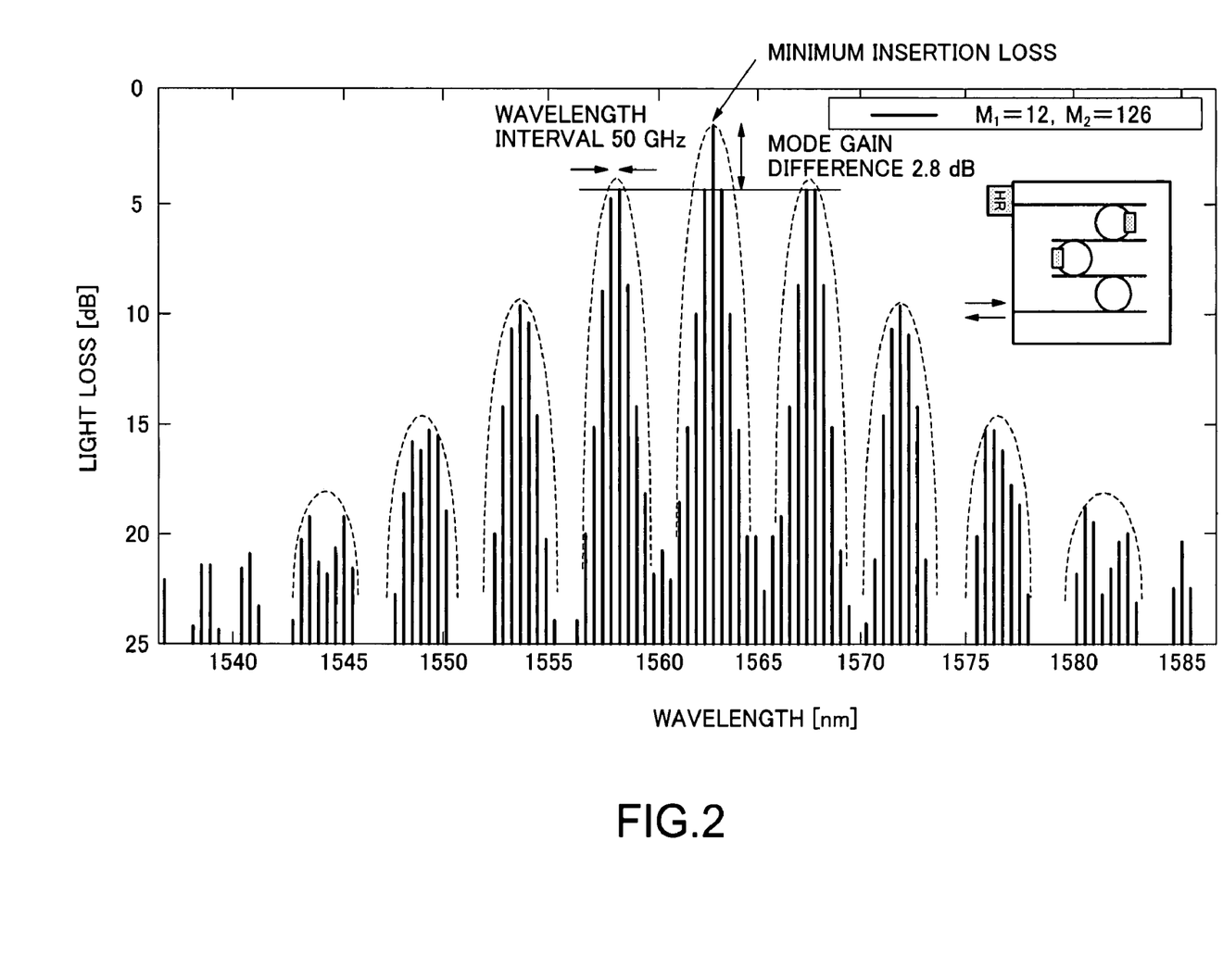
FIG. 2 is a graph showing a light frequency response characteristic viewed from the SOA side of the variable-wavelength light source of the first embodiment of the present invention.

FIG. 2 is a graph showing a light frequency response characteristic viewed from the SOA 15 side of the variable-wavelength light source 10. This will be explained based on FIG. 1 and FIG. 2 below.

The vernier orders of the respective ring resonators 21 to 23 are M1=12, M2=126 and the directional coupler is set so as to operate as a 1:1 coupler. 125 wavelength channels defined by M2-1 exist at intervals of 50 GHz and set in groups of 11 channels defined by M1-1. The mode gain difference which is a difference in loss between the channel with the minimum insertion loss and the channel with the second minimum insertion loss is 2.8 dB. In this way, the mode gain difference is drastically improved from 0.4 dB of the double ring resonator and wavelength stability of the light source is drastically improved.

Here, assuming that the group including the channel with the minimum insertion loss is called a "central group" and the group adjacent to this central group is called an "adjacent group," when the aforementioned Expressions <1> to <3> are satisfied, the following can be said to hold true. As shown with a two-dot dashed line in FIG. 2, the insertion loss of the channel having the second minimum insertion loss in the central group is equal to the insertion loss of the channel having the minimum insertion loss in the adjacent group.

Figure 3:
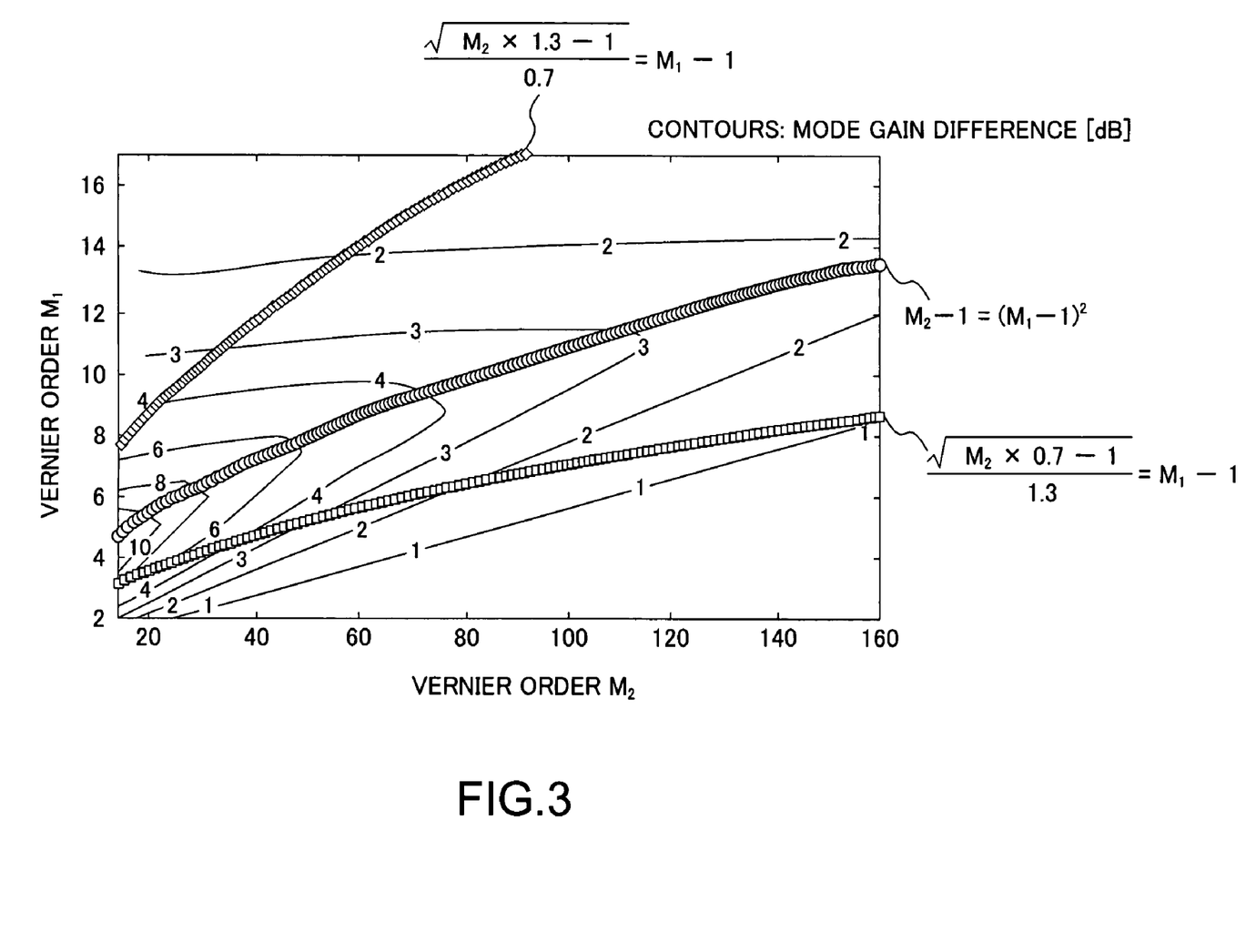
FIG. 3 is a graph showing the relationship between a vernier order and mode gain difference according to the first embodiment of the present invention.

FIG. 3 is a graph showing the relationship between the vernier orders M1, M2 and mode gain difference. This will be explained based on FIG. 1 and FIG. 3 below.

FIG. 3 shows a result of mapping of mode gain differences by taking the vernier orders M1, M2 as the vertical axis and horizontal axis. A relational expression:

$$M2-1=(M1-1)^2 \qquad <3>$$

is plotted superimposed in the figure and it is appreciated that a maximum mode gain difference is obtained when this relational expression is satisfied.

Furthermore, relational expressions when up to ±30% is tolerated with respect to M1, M2 are also plotted. These relational expressions are:

$$\sqrt{(M2 \times 0.7-1)/1.3} = M1-1 \qquad <6>$$

$$\sqrt{(M2 \times 1.3-1)/0.7} = M1-1 \qquad <7>$$

Expression <6> shows a lower limit and Expression <7> shows an upper limit. In this case, the mode gain difference deteriorates by approximately 2 dB compared to the optimum condition.

Figure 4:
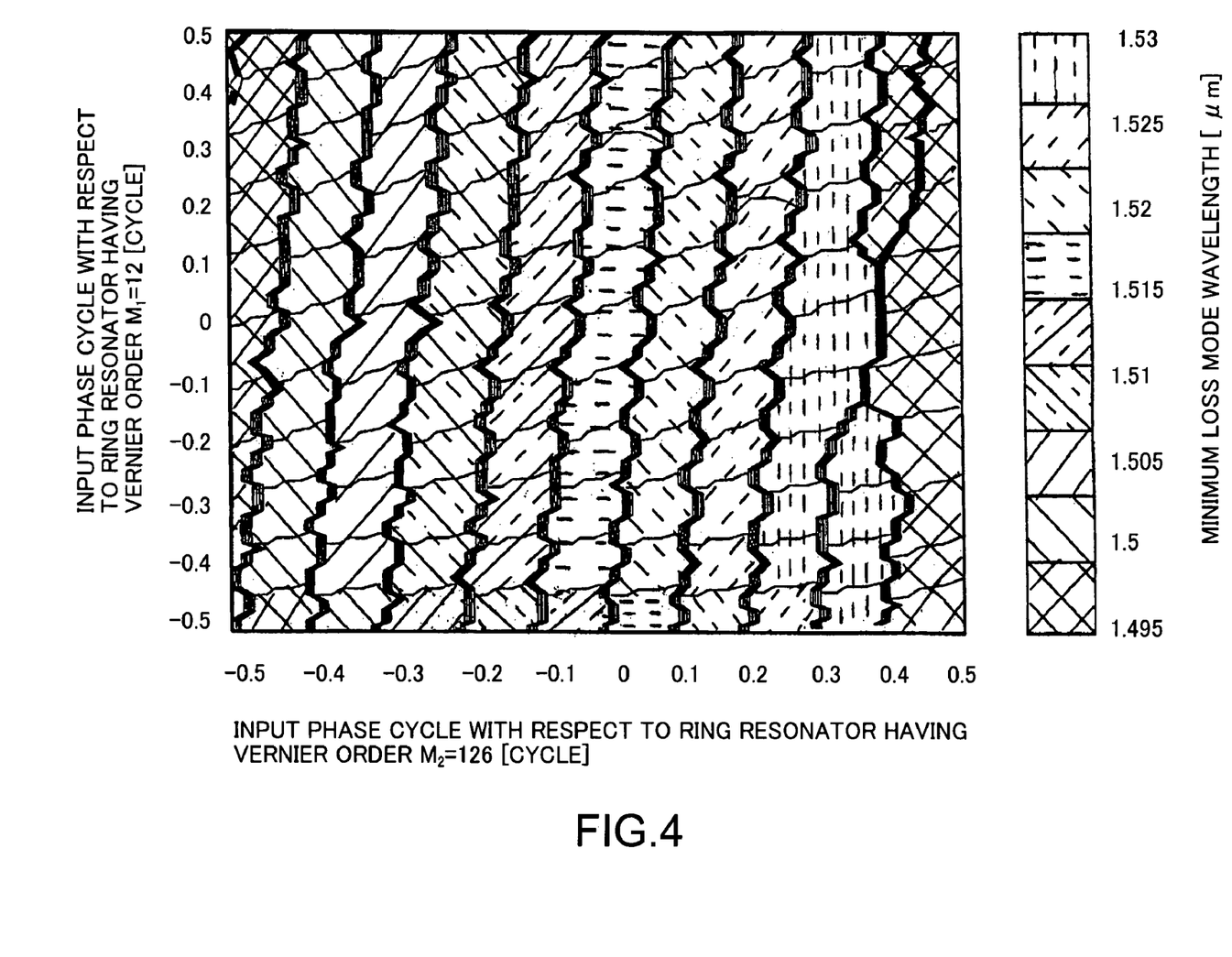
FIG. 4 is a graph showing a frequency characteristic of the variable-wavelength light source of the first embodiment of the present invention.

FIG. 4 is a graph showing the frequency characteristic of the variable-wavelength light source 10. This will be explained based on FIG. 1 and FIG. 4 below.

FIG. 4 shows a mapping of wavelengths in the minimum loss mode when an input phase cycle corresponding to the ring resonator 23 with M2=126 is taken as the horizontal axis and the input phase cycle corresponding to the ring resonator 22 with M1=12 is taken as the vertical axis. It is appreciated that there are 121 wavelength channels and wavelengths are arranged on a 11×11 matrix. It is possible to select a desired wavelength with power supplied to the two TO phase shifters 16, 17. According to the variable-wavelength light source 10, it is possible to realize 99 ch variable-wavelength operations in the L band with the output of 6 to 7 dBm.

As shown above, according to the variable-wavelength light source 10, it is possible to obtain a maximum mode gain difference by optimizing the combination of the vernier orders of the respective ring resonators 21 to 23. In addition to this, this embodiment exerts the following effects.

Since the ring resonators 21 to 23, input/output side waveguide 11 and reflection side waveguide 12 are formed as one piece on the PLC substrate 13, it is possible to achieve miniaturization and high reliability. Since the asymmetric MZI 18 for band restrictions is formed as one piece on the PLC substrate 13, it is possible to further reduce the size and stabilize operation.

The effects of the asymmetric MZI 18 will be explained more specifically.

Since it is not possible to take the gain difference from the wavelength mode outside the variable-wavelength range expanded by the vernier order, oscillation may be started at a wavelength shifted by approximately 40 nm when M2=101. If the asymmetric MZI is designed so as to have an FSR of, for example, 160 GHz to suppress this mode contention, it is possible to suppress the mode loss of only channels having wavelengths close to the desired wavelength and further stabilize the operation.

Figure 5:
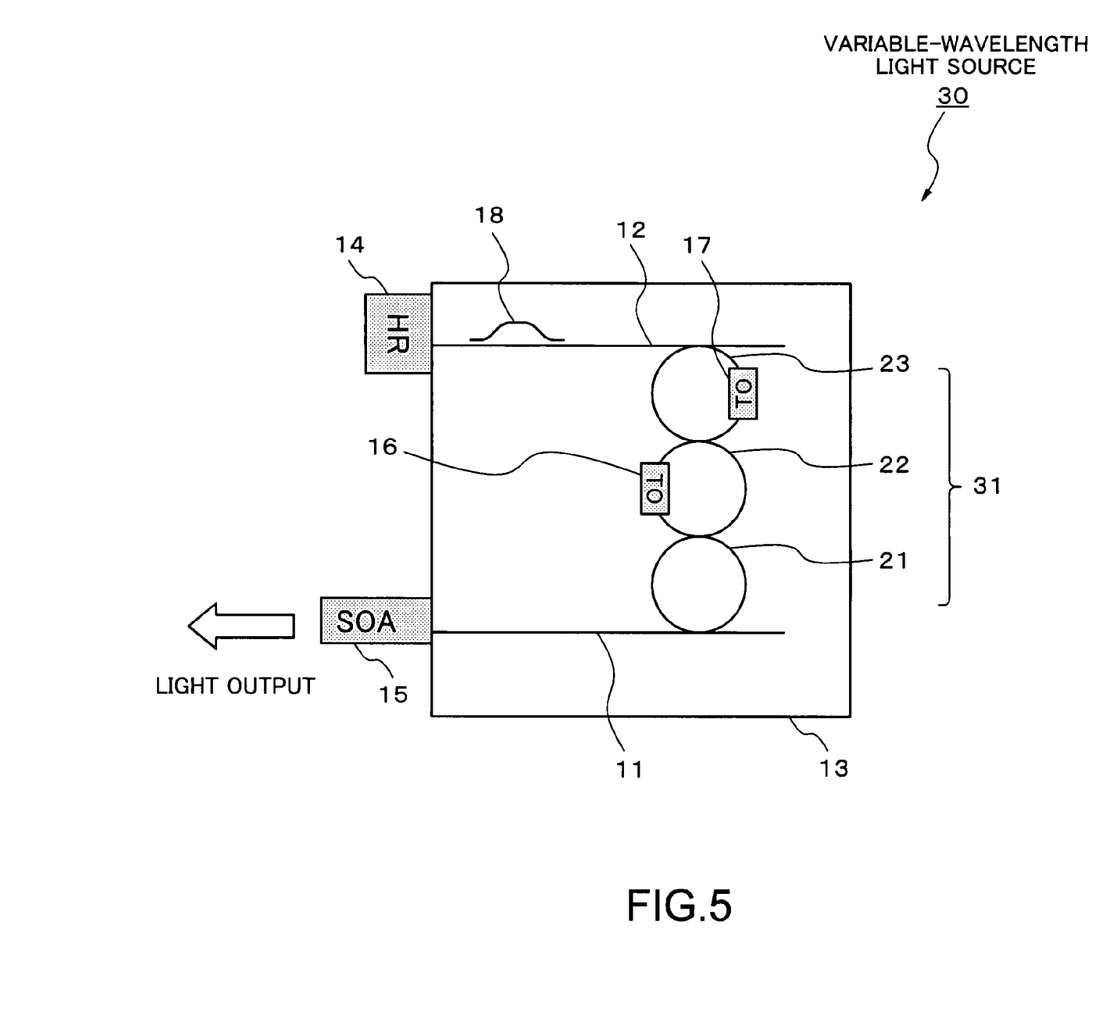
FIG. 5 is a plan view showing a second embodiment of a variable-wavelength light source according to the present invention.

FIG. 5 is a plan view showing a second embodiment of the variable-wavelength light source according to the present invention. This embodiment will be explained based on this drawing below. However, the same parts as those in FIG. 1 are assigned the same reference numerals and explanations thereof will be omitted.

The variable-wavelength light source 30 of this embodiment is provided with a multi-ring resonator 31 with ring resonators 21 to 23 each having different light path length coupled via only directional couplers and without the waveguides 24, 25 of the first embodiment in FIG. 1. The rest of the configuration is the same as that of the first embodiment. This embodiment exerts the same effect as that of the first embodiment and can obtain a light transfer function which is different from that of the first embodiment.

Figure 6:
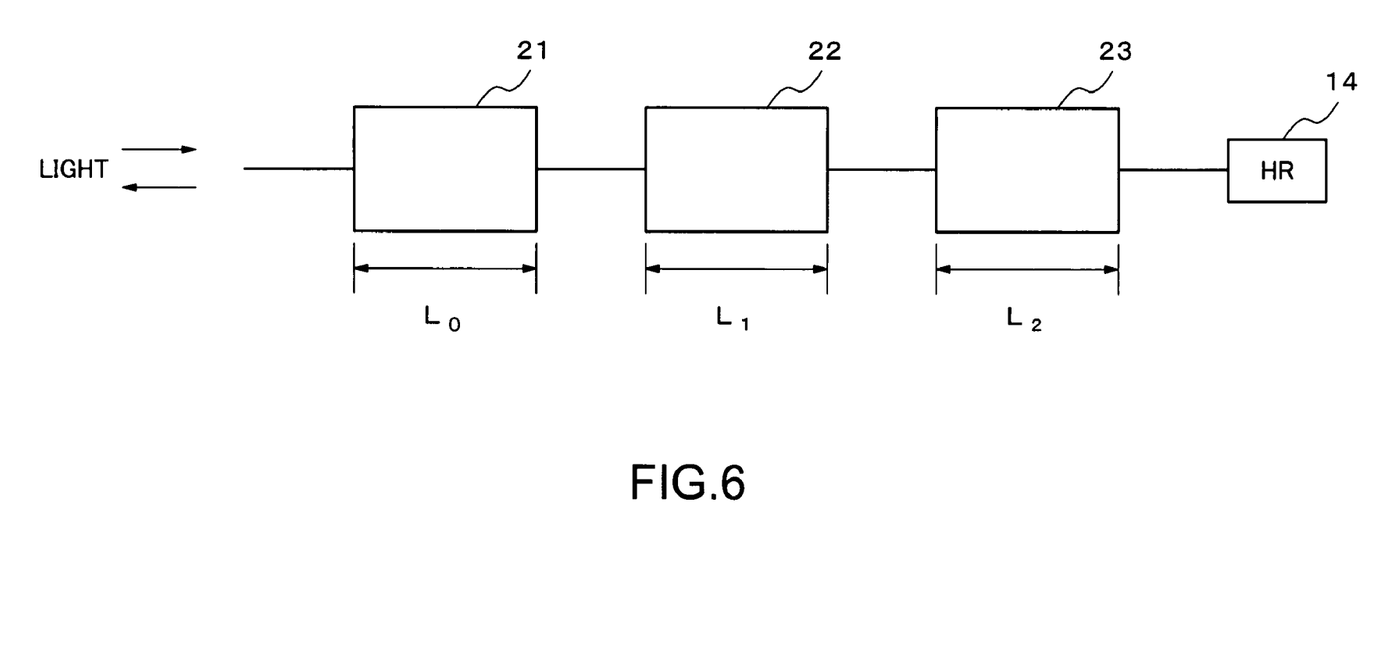
FIG. 6 illustrates a specific example of the light path lengths of the respective ring resonators of the first and second embodiments of the present invention.

FIG. 6 illustrates a specific example of light path lengths L0 to L2 of the respective ring resonators 21 to 23 according to the first and second embodiments. This example will be explained based on this drawing.

Assuming M1=11, M2=101 from Expression <3>. At this time, if L0=4 [mm], L1=4.4 [mm] from Expression <1> and L2=4.04 [mm] from Expression <2>.

The above described first and second embodiments adopt the multiple resonator made up of three resonators, but it is also possible to adopt a multiple resonator made up of four or more resonators.

The present invention optimizes the combination of vernier orders of the respective resonators, and can thereby acquire a maximum mode gain difference. As a result, a large mode gain difference prevents switching of the oscillation wavelength to an unexpected wavelength, and can realize stable operation and thereby provide a variable-wavelength light source with high reliability, high performance and low cost.

The previous description of embodiments is provided to enable a person skilled in the art to make and use the present invention. Moreover, various modifications to these embodiments will be readily apparent to those skilled in the art, and the generic principles and specific examples defined herein may be applied to other embodiments without the use of inventive faculty. Therefore, the present invention is not intended to be limited to the embodiments described herein but is to be accorded the widest scope as defined by the limitations of the claims and equivalents.

Further, it is noted that the inventor's intent is to refrain all equivalents of the claimed invention even if the claims are amended during prosecution.

What is claimed is:

1. A multiple resonator comprising:
   first to third resonators, each having different light path length, connected via optical coupling means, wherein all the following Expressions <1>, <2> and <3> hold:

$$L1 = \{M1/(M1-1)\}L0 \qquad <1>$$

$$L2 = \{M2/(M2-1)\}L0 \qquad <2>$$

$$M2-1 = (M1-1)^2 \qquad <3>$$

where L0 is a light path length of said first resonator, L1 is a light path length of said second resonator and L2 is a light path length of said third resonator, and M1 and M2 are integers of 3 or greater;
   a first waveguide, one end of which is connected to one of said first to third ring resonators via optical coupling means; and
   a second waveguide, one end of which is connected to another of said first to third ring resonators via optical coupling means,
   wherein said first to third resonators are first to third ring resonators made up of ring-shaped waveguides each having different light path length.

2. The multiple resonator according to claim 1, wherein the ring-shaped waveguides of said first to third ring resonators and said first and second waveguides are formed as one piece on a quartz-glass-based substrate.

3. The multiple resonator according to claim 1, further comprising variable-wavelength means for changing the resonance wavelength of said multiple resonator.

4. The multiple resonator according to claim 3, wherein said variable-wavelength means is a film-like heater.

5. The multiple resonator according to claim 3, wherein an asymmetric Mach-Zehnder interferometer is inserted in said first waveguide or said second waveguide.

6. A multiple resonator comprising:
first to third resonators, each having different light path length, connected via optical coupling means, wherein all the following Expressions <1>, <2> and <3> hold:

$$L1=\{M1/(M1-1)\}L0 \qquad <1>$$

$$L2=\{M2/(M2-1)\}L0 \qquad <2>$$

$$\sqrt{(M2\times0.7-1)/1.3}<M1-1<\sqrt{(M2\times1.3-1)/0.7} \qquad <4>$$

where L0 is a light path length of said first resonator, L1 is a light path length of said second resonator and L2 is a light path length of said third resonator, and M1 and M2 are integers of 3 or greater;
a first waveguide, one end of which is connected to one of said first to third ring resonators via optical coupling means; and
a second waveguide, one end of which is connected to another of said first to third ring resonators via optical coupling means,
wherein said first to third resonators are first to third ring resonators made up of ring-shaped waveguides each having different light path length.

7. A variable-wavelength light source comprising:
a multiple resonator comprising first to third ring resonators made up of ring-shaped waveguides, each having different light path length, connected via optical coupling means, wherein all the following Expressions <1>, <2> and <3> hold:

$$L1=\{M1/(M1-1)\}L0 \qquad <1>$$

$$L2=\{M2/(M2-1)\}L0 \qquad <2>$$

$$M2-1=(M1-1)^2 \qquad <3>$$

where L0 is a light path length of said first resonator, L1 is a light path length of said second resonator and L2 is a light path length of said third resonator and M1 and M2 are integers of 3 or greater;
a substrate on which an input/output side waveguide, one end of which is connected to one of said first to third ring resonators via optical coupling means and a reflection side waveguide, one end of which is connected to another of said first to third ring resonators via optical coupling means are formed;
a light reflector provided at the other end of said reflection side waveguide of said substrate;
a light input/output unit, a light input/output end of which is connected to the other end of said input/output side waveguide of said substrate via a non-reflective film; and
a variable-wavelength unit which changes a resonance wavelength of said multiple resonator.

8. The variable-wavelength light source according to claim 7, wherein said light input/output unit is a semiconductor optical amplifier or optical fiber amplifier.

9. The variable-wavelength light source according to claim 7, wherein said variable-wavelength unit is a film-like heater provided on said substrate.

10. The variable-wavelength light source according to claim 9, wherein an asymmetric Mach-Zehnder interferometer is inserted in said input/output side waveguide or said reflection side waveguide.

11. The multiple resonator according to claim 7, wherein the first to third ring resonators are directly coupled to each other and are not separated from each other by waveguides.

12. A multiple resonator comprising:
first to third resonators, each having different light path length, connected via optical coupling means, wherein all the following Expressions <1>, <2> and <3> hold:

$$L1=\{M1/(M1-1)\}L0 \qquad <1>$$

$$L2=\{M2/(M2-1)\}L0 \qquad <2>$$

$$M2-1=(M1-1)^2 \qquad <3>$$

where L0 is a light path length of said first resonator, L1 is a light path length of said second resonator and L2 is a light path length of said third resonator, and M1 and M2 are integers of 3 or greater,
wherein said first to third resonators are first to third ring resonators made up of ring-shaped waveguides each having different light path length, and
wherein the first to third ring resonators are directly coupled to each other and are not separated from each other by waveguides.

13. A multiple resonator comprising:
first to third resonators, each having different light path length, connected via optical coupling means, wherein all the following Expressions <1>, <2> and <3> hold:

$$L1=\{M1/(M1-1)\}L0 \qquad <1>$$

$$L2=\{M2/(M2-1)\}L0 \qquad <2>$$

$$\sqrt{(M2\times0.7-1)/1.3}<M1-1<\sqrt{(M2\times1.3-1)/0.7} \qquad <4>$$

where L0 is a light path length of said first resonator, L1 is a light path length of said second resonator and L2 is a light path length of said third resonator, and M1 and M2 are integers of 3 or greater;
wherein said first to third resonators are first to third ring resonators made up of ring-shaped waveguides each having different light path length, and wherein the first to third ring resonators are directly coupled to each other and are not separated from each other by waveguides.

* * * * *